United States Patent
Larsen et al.

(10) Patent No.: US 6,339,194 B1
(45) Date of Patent: Jan. 15, 2002

(54) SUPPORTED SUPERCONDUCTOR

(75) Inventors: Jørgen Gutzon Larsen, Søborg; Jens Christiansen, Lyngby, both of (DK)

(73) Assignee: Haldor Topsoe A/S, Lyngby (DK)

( * ) Notice: Subject to any disclaimer, the term of this patent is extended or adjusted under 35 U.S.C. 154(b) by 0 days.

(21) Appl. No.: 09/264,811

(22) Filed: Mar. 9, 1999

Related U.S. Application Data

(60) Provisional application No. 60/077,938, filed on Mar. 13, 1998.

(51) Int. Cl.[7] .............................................. H01B 12/14
(52) U.S. Cl. ...................... 174/125.1; 29/599; 505/431; 505/704; 505/740
(58) Field of Search .................. 174/125.1, 15.4; 505/430, 431, 433, 704, 740, 230; 555/434; 29/599

(56) References Cited

U.S. PATENT DOCUMENTS 4,988,669 A * 1/1991 Dersch .................... 174/125.1
5,043,320 A * 8/1991 Meyer et al. .............. 174/15.4
5,122,507 A * 6/1992 Yamamoto et al. ......... 505/703
5,298,679 A * 3/1994 Wu et al. ................... 505/704
5,319,843 A * 6/1994 Primdahl et al. ........ 174/125.1

* cited by examiner

Primary Examiner—Albert W. Paladini
(74) Attorney, Agent, or Firm—Ostrolenk, Faber, Gerb & Soffen, LLP

(57) ABSTRACT

A supported superconductor device which is useful as a superconducting current lead or as a high voltage current regulator. The device is formed of a tubular support, with a layer of ceramic, glassy or glass ceramic material adhered to the inner wall of the tubular support, the layer of material embedding a superconducting layer centrally arranged within the material of the first layer, the material of the first layer having a minimum expansion coefficient and being reinforced with pore filling material.

11 Claims, 1 Drawing Sheet

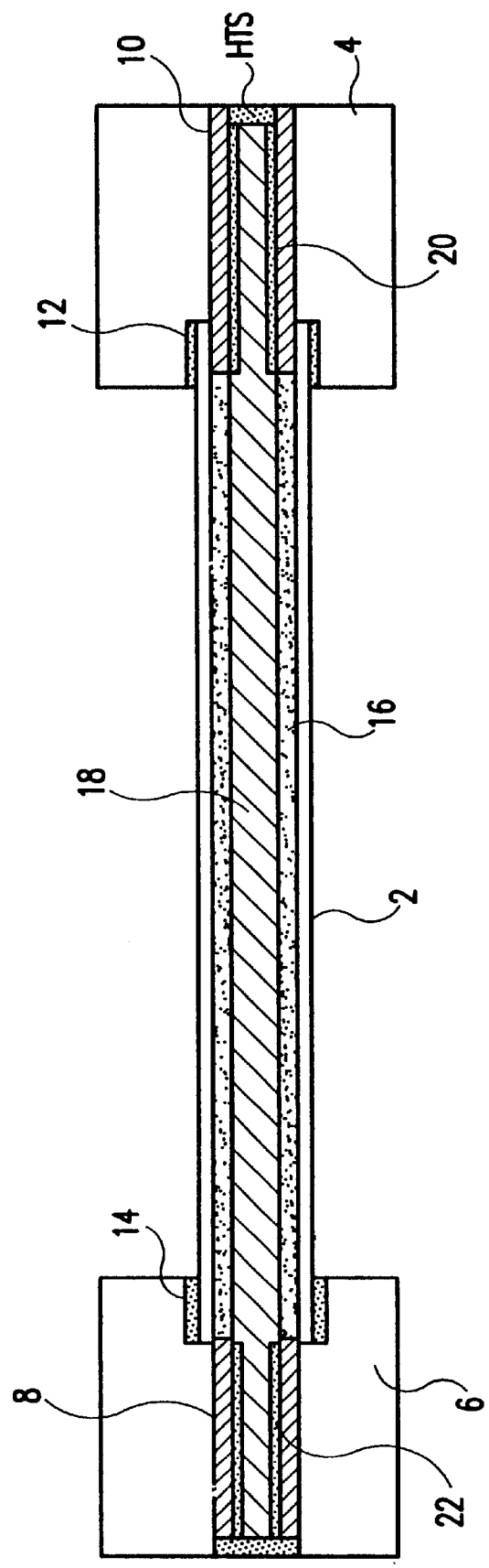

SUPPORTED SUPERCONDUCTOR

This application claims the benefit of U.S. Provisional Application No. 60/077,938, filed Mar. 13, 1998.

FIELD OF THE INVENTION

The present invention relates to a supported superconductor device which is useful as a superconducting current lead or as a high voltage current regulator.

SUMMARY OF THE INVENTION

In its most general embodiment, the invention provides a supported superconducting device comprising a tubular support with a first layer of ceramic, glassy or glass ceramic material adhered to the inner wall of the tubular support and embedding a superconducting layer centrally arranged within the support.

The first layer material is reinforced with pore filling material of a suitable low viscous and self curing property, including polymeric organic material, in particular, epoxy resins.

Materials convenient for use as the embedding material in the first layer are preferably selected from inorganic material with minimal thermal expansion coefficient, including ceramic material of the cordierite type or glassy material, in particular, quartz or lithium alumina silicate glass.

The above materials are able to transfer compression force from the tubular support to the superconducting layer.

The superconducting layer may consist of any of the known brittle superconductors, in particular, high temperature superconductors.

The invention concerns furthermore a method of supporting a ceramic superconductor using a porous material in a perforated tube. Terminals of an electrical conducting material are connected at each end of the tube. The superconductor material is arranged inside the tube and is soldered to the two terminals. The space between tube and superconductor is filled with a porous material allowing liquid or gas to diffuse into the superconducting material through the perforations in the tube and the pore in the porous material. The superconducting material may be in form a centrally arranged superconductive rod or elongated plate.

The tube may be formed of metal, glass, ceramics, polymer or composites thereof. The perforations in the tube may be of various shapes and sizes.

The terminals are made from electrically conducting material, such as steel, copper, silver, gold or other metals or alloys. The terminals are connected to the tube ends by glueing, screwing them into the tube, or using screws. Preferably, at least one of the terminals is provided with a hole, allowing the superconducting material to be introduced into the tube and soldered to the terminals.

In order to obtain low contact resistance between the superconductor and the terminals, the superconductor is preferably coated with silver. The superconductor is introduced into the tube and soldered to the contacts.

As a major advantage of the invention, the supported superconductor allows to connect large electrical terminals to the superconducting material without stressing the material by adhering the terminals to the tubular support prior to installation of the superconducting material.

Porous filler material may be produced by coating particles (metals, glass, ceramics or polymers) with a binder or mixing the particles and binder with an amount of binder which is less than the volume between the packed particles. The particles are mixed with the binder prior to introducing the filler material into the tube or after introduction of the material into the tube. Thereby, gas or liquid is able to diffuse to the superconducting material through the perforations in the tube and further through the pores in the filler material.

The superconducting material is mechanically supported by the filler material and the tube. The supporting tube and filler material may be made electrically insulating by employing electrical insulating material for the manufacture of the tube and the filler. The support may be an electrical conductor in the form of a conducting tube and/or particle and binder system. The above superconductor device may be used in combination with forced flow cooling, which allows the use of a higher quench current without damaging the superconductor as compared with a non-porous support.

Other features and advantages of the present invention will become apparent from the following description of the invention which refers to the accompanying drawings.

BRIEF DESCRIPTION OF THE DRAWING

The sole drawing is a cross-sectional view through a supported superconductor device according to a specific embodiment of the invention for use in a superconducting current lead.

DETAILED DESCRIPTION OF THE PREFERRED EMBODIMENT

Referring to the drawing, the supported superconductor device of the present invention consists of a support tube 2 connected to electrical copper terminals 4 and 6. Support tube 2 is adhered to terminals 4 and 6 and closed at its end by solder 8 and 10. Tube 2 is furthermore connected to the terminal by solder 12 and 14.

Inside tube 2, a first layer 16 adhered to inner wall of the tube, embeds superconducting material 18.

The superconducting material is electrically connected to terminals 4 and 6 by means of a solder 10 and 8, respectively. In order to improve electrical connection of the superconducting material, a thin film of silver 20, 22 is supported on the material in the region adjacent to solder 10 and 8, respectively.

An advantageous feature of the invention is that the superconducting material 18 is under constant axial compression at all operating temperatures, and this must be taken into account when choosing materials. The device may then be manufactured by the following procedure.

A precision made assembly jig is used, comprising two identical open half-cylinders formed of steel and which can be screwed together. In this jig, Cu terminals 4 and 6 (the lower I and the upper II) are placed with the correct orientation and distance between them. Likewise, tube 2, surrounding superconducting material 18, is placed in the corresponding mounting compression in the Cu terminals and is then held in place by the two halves of the jig which are then screwed together. The whole assembly is upended (i.e. terminal I on top), and material 18 is slid into the tube. The holes in the terminals are then soldered in terminal II, the solder (10) being fed through holes provided in tube 2.

The space between the superconducting material and the inside wall of tube 2 is filled with a suitable granulate 16, and the whole assembly is vibrated to ensure compact filling. The top level of granulate 16 is filled to a level corresponding to the level of terminal I. Above the granulate is placed a measured quantity of low temperature solder 24 sufficient to ensure, when melted, a good connection between material 8 and terminal I. Before melting, however, the middle portion of tube 2 is heated to a temperature slightly below the melting point of the solder. When the soldering process is completed, the tube is allowed to cool, and due to contraction of tube, the superconducting material will be held in a state of compression.

Finally, a suitable epoxy resin is injected into granulate 16 which ensures, after hardening, that the superconducting material is rigidly supported inside the tube.

EXAMPLE

Preparation of a superconducting device with perforated tubular support according to a specific embodiment of the invention.

Approximately 40 regularly distributed holes (4 mm diameter) are drilled in a glass fiber/resin-tube (outer diameter: 9 mm) along the periphery, and 7 mm threaded holes are made at each end of the tube. Two copper terminals with an outer thread of 7 mm and an inner hole of 4.5 mm are screwed into each end of the tube. A superconductive rod is introduced into the unit through the holes in the copper terminals. Soldering connects the superconductor and the copper terminals. The space between the tube and the superconductor is filled up with a 5 mm glass spheres/epoxy mixture (95%/5% by weight). The mixture is introduced via the holes in a glass-fiber/resin-tube.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A superconducting device comprising:
    a tubular support;
    a first layer of ceramic, glassy or glass ceramic material adhered to the inner surface of the tubular support, the material of the first layer being reinforced with pore filling material; and
    a superconducting layer centrally arranged within the material of the first layer.

2. A superconducting device as recited in claim 1, wherein the tubular support is provided with perforations.

3. A superconducting device as recited in claim 1, wherein the tubular support has a larger thermal expansion coefficient than that of the superconducting material.

4. A current lead comprising the superconducting device of claim 1.

5. A current regulator comprising the superconducting device of claim 1.

6. A superconducting device as recited in claim 1, wherein the first layer has a smaller thermal expansion coefficient than that of the tubular support, so that the superconducting layer is held in a state of compression.

7. A superconducting device comprising:
    a tubular support;
    a porous filler within the tubular support; and
    a superconducting material embedded in the porous filler, wherein the tubular support has a larger thermal expansion coefficient than that of the superconducting material, so that the superconducting layer is held in a state of compression by the tubular support.

8. A superconducting device as recited in claim 7, wherein the tubular support is provided with perforations.

9. A current lead comprising the superconducting device of claim 7.

10. A current regulator comprising the superconducting device of claim 7.

11. A process for the manufacture of a superconductor, comprising the steps of:
    (i) introducing superconducting material into a tubular support;
    (ii) embedding the superconducting material with filler material; and
    (iii) closing the tubular support with a solder.

* * * * *